United States Patent [19]
Yamaguchi et al.

[11] Patent Number: 4,895,231
[45] Date of Patent: Jan. 23, 1990

[54] CARRYING CASE

[75] Inventors: Shigeru Yamaguchi; Masanori Matsuishi, both of Nara; Shunichi Miyako, Yamatokoriyama, all of Japan

[73] Assignee: Sharp Kabushiki Kaisha, Osaka, Japan

[21] Appl. No.: 242,976

[22] Filed: Sep. 12, 1988

[30] Foreign Application Priority Data

Sep. 14, 1987 [JP] Japan .......................... 62-140655[U]
Sep. 14, 1987 [JP] Japan .......................... 62-140656[U]

[51] Int. Cl.⁴ ..................... B65D 25/28; A45G 13/10
[52] U.S. Cl. ..................... 190/115; 190/119; 364/708; 400/691; 70/67; 16/126; 312/244
[58] Field of Search ............... 190/113, 114, 115, 116, 190/119, 121; 364/708; 400/691, 693; 70/67; 16/126; 292/DIG. 61; 312/208, 244

[56] References Cited

U.S. PATENT DOCUMENTS

| D. 235,480 | 6/1975 | Baughman | 312/208 X |
| 1,074,133 | 9/1913 | Neustaedter | 190/115 X |
| 3,793,674 | 2/1974 | Kneier | 16/126 |
| 4,157,763 | 6/1979 | Betlejewski et al. | 312/244 X |
| 4,677,832 | 7/1987 | Remington | 190/119 X |

FOREIGN PATENT DOCUMENTS

| 628171 | 5/1963 | Belgium | 190/115 |
| 1198020 | 8/1965 | Fed. Rep. of Germany | 190/115 |
| 226769 | 9/1985 | Fed. Rep. of Germany | 190/115 |
| 2467562 | 5/1981 | France | 190/115 |

*Primary Examiner*—William Price
*Attorney, Agent, or Firm*—Birch, Stewart, Kolasch & Birch

[57] ABSTRACT

A carrying case for a lap-top model of a personal computer, a portable word processor or the like comprises a generally box-like casing accommodating various electric components therein and having a display panel assembly generally hingedly supported for movement in a direction towards and away from the casing, a foldable handle assembly supported for pivotal movement between concealed and projected positions, and at least one lock mechanism operable to lock the panel assembly in a closed position to the canister. The lock mechanism comprises an engagement member secured to the panel assembly and a releaseable one-piece member including a release button and a pawl member engageable with the engagement member. All necessary support elements to which the handle assembly is fitted are integrally formed with a bottom wall of the casing.

7 Claims, 3 Drawing Sheets

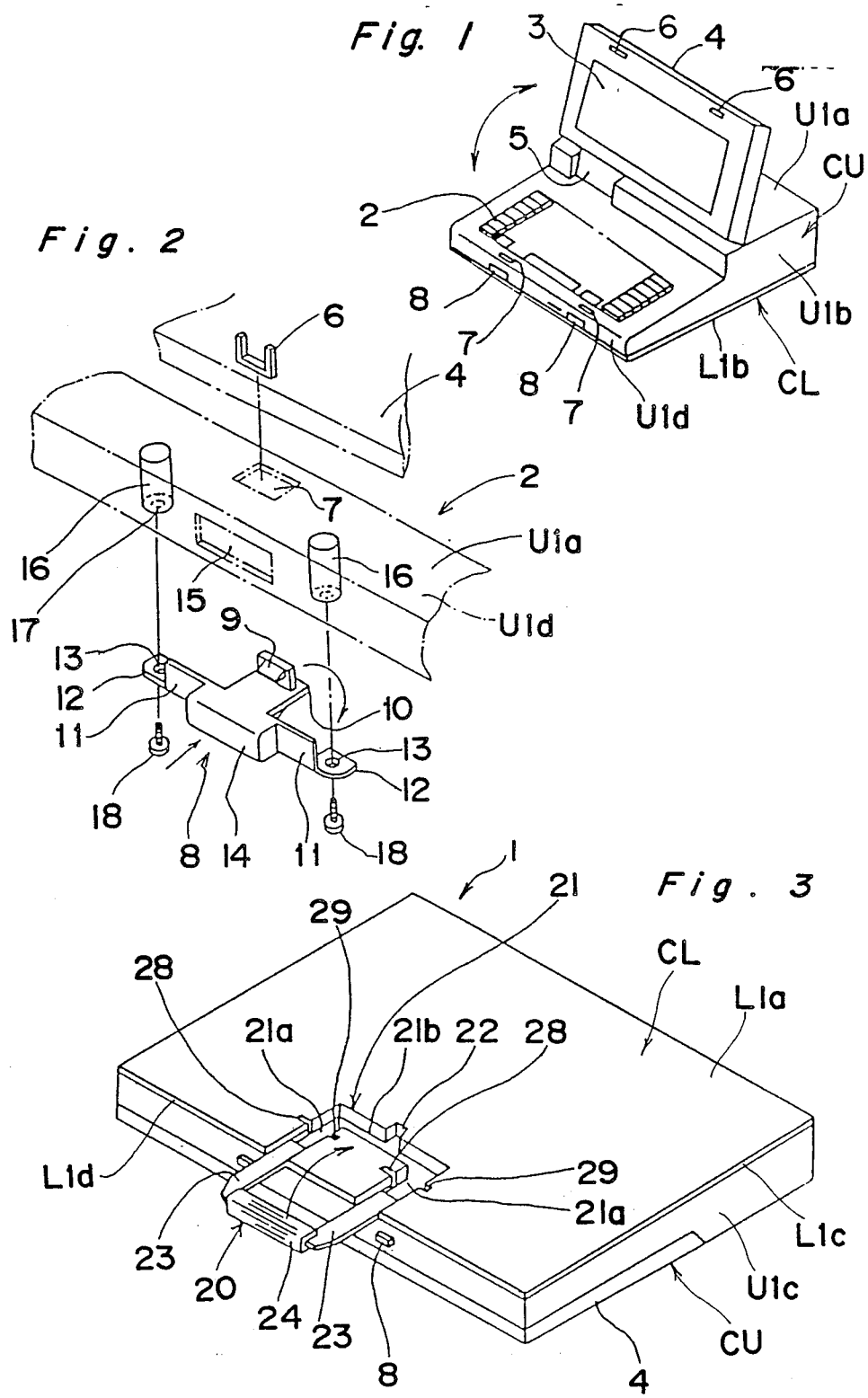

CARRYING CASE

BACKGROUND OF THE INVENTION

1. Field of the Invention:

The present invention generally relates to a carrying case and, more particularly, to a casing structure for a portable electric appliance such as, for example, a lap-top model of personal computer, a portable word processor, a portable electronic calculator or the like whose casing is designed for hand-held transportation.

2. Description of the Prior Art:

The lap-top model for a personal computer or a portable word processor currently available on the market comprises a generally box-like casing accommodating therein various circuit components and having a keyboard arrangement and a removable or non-removable display panel assembly. The display panel assembly is generally hingedly supported for movement between a closed position, in which the display panel assembly serves as a lid for concealing the keyboard arrangement for transportation, and an opened position in which the keyboard arrangement is made accessible to an operator and in which the display panel assembly is held in a generally erected position with a display panel being visible to the operator.

The prior art casing of the type referred to above has two major problems; one associated with a lock mechanism for locking the display panel assembly in the closed position and the other associated with a foldable handle assembly for hand-held transportation.

According to the prior art, the lock mechanism comprises a pawl member installed in one of the casing and the display panel assembly and supported for sliding motion between locked and released positions, a spring member for urging the pawl member in one direction towards the locked position and an engagement member installed in the other of the casing and the display panel assembly and engageable with the pawl member when the latter is moved towards the locked position.

While the lock mechanism used in the prior art casing functions satisfactorily, the lock mechanism is somewhat complicated. More specifically, the use of the biasing spring member increases the number of necessary component parts and, also, the use of the spring member tends to increase the number of fabricating steps during assembly of the casing.

When it comes to the handle assembly, the handle assembly used in the prior art casing generally comprises a generally U-shaped handle foldably connected at its opposite free ends to the casing through hinge members. The use of the hinge members tends to increase the number of necessary component parts required for the casing as a whole. In addition, considering the handle supported for movement between a projected position, in which the handle is exposed outside the perimeter of the casing for access by the hand of an operator, and a concealed position in which the handle is retracted inwardly of the casing, the casing is required to have a correspondingly U-shaped recess for accommodating the handle therein when the handle is in the concealed position. The recess for the handle generally extends inwardly of the casing and, therefore, the maximum available volume of the casing is correspondingly reduced, posing a problem in that some of the circuit component parts cannot be installed within the casing at a location in the vicinity of the recess. Therefore, the casing is required to be relatively bulky for all of the circuit component parts to be accommodated therein.

SUMMARY OF THE INVENTION

Accordingly, the present invention has been devised with a view to substantially eliminating the above discussed problems inherent in the prior art carrying case for a portable electric appliance and has for its essential object to provide an improved carrying case which does not require an increased number of component parts and is therefore inexpensive to make.

Another important object of the present invention is to provide an improved carrying case wherein the lock mechanism is simplified in structure and function with no separate spring member employed, thereby rendering the lock mechanism to be readily fabricated.

A further important object of the present invention is to provide an improved carrying case wherein the handle assembly is simplified in structure and function with no separate hinge member employed, thereby rendering the handle assembly to be readily installed.

To this end, according to one aspect of the present invention, there is provided a carrying case of a type which comprises a generally box-like casing accommodating therein various electric components and having a panel assembly generally hingedly supported for movement in a direction towards and away from the casing and at least one lock mechanism operable to lock the panel assembly in a closed position to the canister.

The lock mechanism comprises an engagement member secured to the panel assembly and a release member of one-piece construction made of synthetic resin and including a release button, a support tongue formed integrally with and extending from the release button in a direction inwardly of the canister, a pawl member integrally formed with and extending from one end of the support tongue remote from the release button in a direction generally perpendicular to the support tongue, a pair of resiliently yieldable, generally plate-like arms formed integrally with and extending from the release button in a direction away from each other and also perpendicular to the support tongue, and a perforated fitting lug formed integrally with one end of each of the resiliently yieldable arms remote from the release button and lying in a plane perpendicular to the associated resiliently yieldable arm.

The release member is secured to the casing with set screw members inserted through perforations in the respective fitting lugs and then screwed into the wall of the casing. When and so long as the panel assembly is locked in a closed position with the pawl member engaged with the engagement member in the panel assembly, the application of an external pushing force to the release button results in the collapse of the release button inwardly of the casing with the arms consequently deformed against their own resiliency, thereby permitting the pawl member to disengage from the engagement member in the panel assembly.

Since the release member is of one-piece construction made of synthetic resin including the release button, the support tongue, the pawl member, the pair of arms and the perforated fitting lugs and since the lock mechanism according to the present invention does not require the use of the separate spring such as required in the prior art carrying casing, it is clear that the carrying casing according to the present invention can be easy to fabricate at a substantially reduced cost.

In another aspect of the present invention, there is provided a carrying case of a type which comprises a generally box-like casing accommodating therein various electric components and having a bottom opening, a bottom lid secured from below to the casing to close the bottom opening thereof and formed with a generally U-shaped pocket during the molding of the bottom lid by the use of any known plastics molding technique, and a foldable handle assembly hingedly carried by the bottom lid for pivotal movement between a concealed position, in which the handle assembly is housed within the U-shaped pocket without protruding from the bottom lid, and an exposed position in which the handle assembly is exposed outside the perimeter of the casing for access by the hand of an operator.

The U-shaped pocket includes a pair of side grooves and a bridging groove continued to and extending between respective ends of the side grooves. Opposite walls defining each of the side grooves are perforated to allow portions of the bottom lid in register with the perforations in those walls to serve as respective slide supports. Those portions of the bottom lid in register with the perforations in those walls are formed with cutouts. The bottom lid is also formed, for each slide support, with a pair of stopper projections each located at one end of the associated slide support that is remote from the bridging groove, and a thin elastic plate is formed in face-to-face relationship with each slide support.

On the other hand, the handle assembly includes a pair of spaced arms each of said arms having one end formed into a generally T-shaped configuration with bosses protruding therefrom in a direction away from each other and perpendicular to the associated arm. This handle assembly is coupled to the bottom lid with the bosses in the arms having been inserted through the cutouts until they are engaged between the respective pairs of the stopper projections after having slid along the respective slide supports. The handle assembly so coupled to the bottom lid is pivotable about the common longitudinal axis passing through the bosses in the arms in a controlled manner with the bosses in the arms resiliently pressed by the thin elastic plates.

The handle assembly when in the concealed position is completely accommodated within the U-shaped pocket. However, when the operator desires to transport the electric appliance with the handle assembly held in his or her hand, he or she should pull the handle assembly in the concealed position towards the exposed position, permitting it to be pivoted about the common longitudinal axis of the bosses in the arms.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In any event, these and other objects and features of the present invention will become clear from the following description taken in conjunction with preferred embodiments thereof with reference to the accompanying drawings which are given by way of illustration only, and thus are not limitative of the present invention, and in which:

FIG. 1 is a schematic perspective view of a lap-top model of a personal computer with a display panel assembly held in an erected position;

FIG. 2 is an exploded view, on an enlarged scale, showing a lock mechanism employed in the lap-top model according to the present invention;

FIG. 3 is a perspective view, on an enlarged scale, of the lap-top model as viewed from below, showing a handle assembly according to the present invention;

DETAILED DESCRIPTION OF THE EMBODIMENTS

Figure 4:
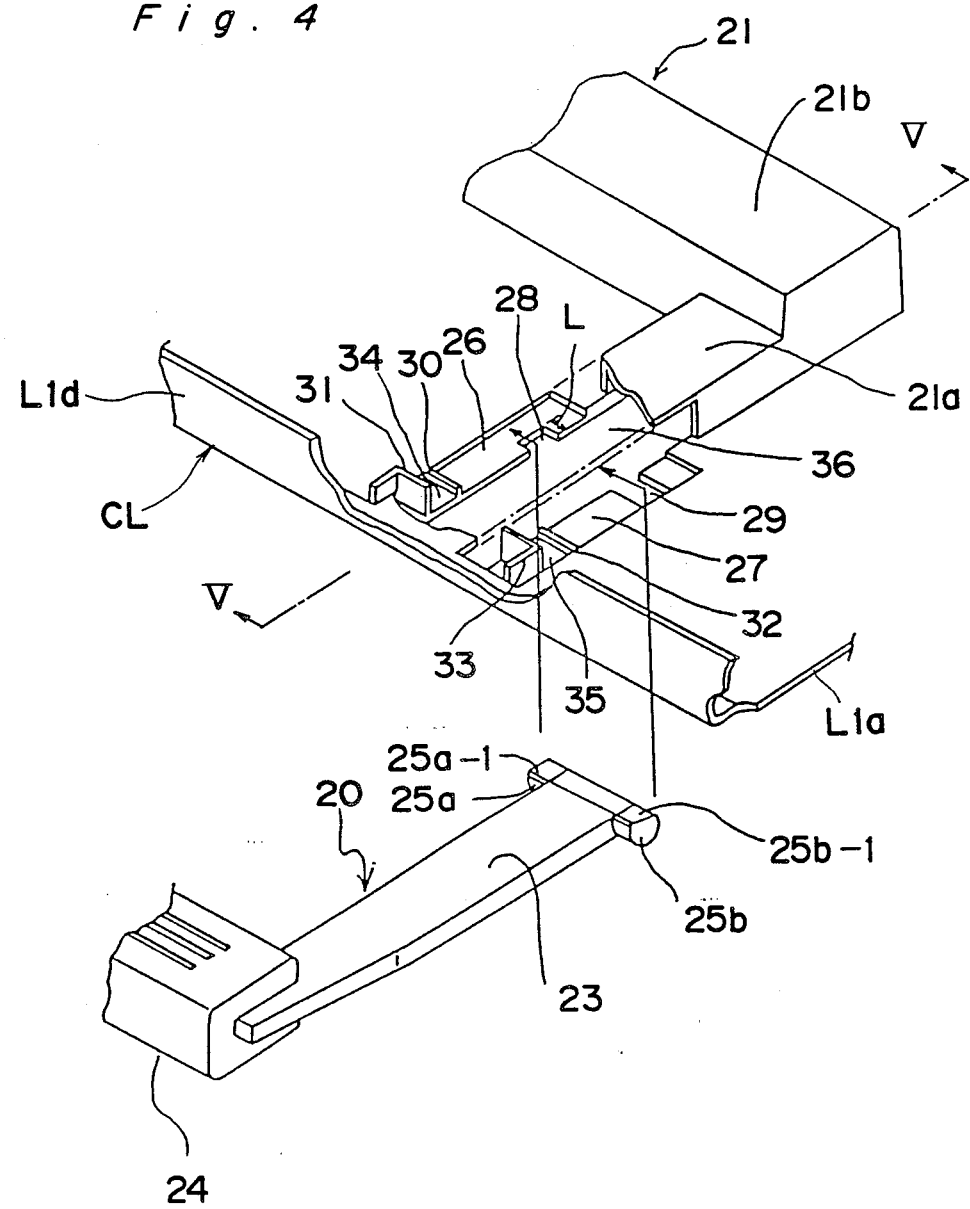
FIG. 4 is a perspective view, on a further enlarged scale and with a portion cut away, showing the connection details between one of the handle arms with a bottom plate in the lap-top model shown in FIG. 3.

Before the description of preferred embodiments of the present invention proceeds, it is to be noted that like numerals are employed to designate like parts throughout the accompanying drawings.

Referring first to FIGS. 1 and 3, a personal computer lap-top model is shown which comprises a carrying case generally identified by 1 and accommodating various electric component parts therein. The carrying case comprises generally rectangular box-like lower and upper cabinets CL and CU, each of said lower and upper cabinets CL and CU are composed of a top or bottom wall L1a or U1a, a pair of opposite side walls L1b and L1c or U1b and U1c and rear and front walls (only the front wall being designated by L1d or U1d while the rear wall is not shown) all molded together by the use of any known plastics molding technique. The lower cabinet CL has a depth smaller than that of the upper cabinet CU. The lower cabinet CL is secured from below to the upper cabinet CU so as to close a bottom opening thereof. The top wall U1a of the upper cabinet CU is stepped down with a front portion thereof held at a level lower than a rear portion thereof, and the front portion of the top wall U1a is formed with a generally rectangular opening extending alongside the front wall U1d for accommodating a keyboard arrangement 2. The keyboard arrangement 2 is mounted above the lower cabinet CL and is exposed for access to hands of an operator.

The upper cabinet CU also has a display panel assembly 4 hingedly supported at 5 by the upper cabinet CU for pivotal movement in a direction close towards and away from the keyboard arrangement 2 and between folded and erected positions in a manner as indicated by the arrow-headed line. The display panel assembly 4 has a display panel 3 for the display of information processed by the electric appliance. When in the folded position, the display panel assembly 4 completely covers and protects the keyboard arrangement 2 substantially as shown in FIG. 3, but, when in the erected position, the display panel assembly 4 permits the display panel 3 to be viewed by the operator of the lap-top personal computer as shown in FIG. 3.

The illustrated carrying case employs two releasable lock mechanisms of identical construction for locking the display panel assembly 4 in the folded position once it has been moved thereto. For the sake of brevity, the details of only one of the releasable lock mechanisms will now be described with particular reference to FIGS. 1 and 2.

The lock mechanism comprises a generally U-shaped engagement member 6 secured to the panel assembly 4 and a release member 8 of one-piece construction made of synthetic resin and including a release button 14, a support tongue 10 formed integrally with and extending from the release button 14 in a direction inwardly of the upper cabinet CU, a pawl member 9 integrally formed with and extending from one end of the support tongue 10 remote from the release button 14 in a direction generally perpendicular to the support tongue 10, a pair of resiliently yieldable, generally plate-like arms 11 formed integrally with and extending from the release button 14 in a direction away from each other and also perpendicular to the support tongue 10, and a perforated fitting lug 12 formed integrally with one end of each of the resiliently yieldable arms 11 remote from the release button 14 and lying in a plane perpendicular to the associated resiliently yieldable arm 11. The fitting lugs 12 have respective fitting holes 13 defined therein for the passage therethrough of set screw members 18.

Each of the plate-like arms 11 lies in a plane which may be parallel to the front wall U1d when the lock mechanism is installed in position as will be described later whereas each of the fitting lugs 12 integral with the respective plate-like arms 11 lies in a plane perpendicular to the adjacent plate-like arm 11 and may, when the lock mechanism is installed in position, extend in a direction inwardly of the upper cabinet UC and generally perpendicular to the front wall U1d.

As best shown in FIG. 2, for each releasable lock mechanism, the front wall U1d of the upper cabinet CU has a generally rectangular opening 15 defined therein through which the release button 14 is exposed to the outside for access by an operator's finger, and a front edge portion of the top wall U1a of the upper cabinet CU adjacent the rectangular opening 15 is formed with an access slot 7 when the display panel assembly 4 is moved to the folded position. The associated engaging member 6 which is attached to the display panel assembly 4 is inserted through slot 7 for engagement with the pawl member 9 as will subsequently be described.

The front edge portion of the top wall U1a of the upper cabinet CU is integrally formed with a pair of generally cylindrical posts 16 positioned interiorly of the upper cabinet U1a and on respective sides of the associated access slot 7 and extending in a direction substantially parallel to the front wall U1d of the upper cabinet CU. Each of the cylindrical posts 16 have a free end formed with a respective screw hole 17. The spacing between the cylindrical posts 16 corresponds to the spacing between the fitting holes 13 in the fitting lugs 12 integral with the release button 14.

The release member 8 of each of the lock mechanisms is secured from below to the upper cabinet CU with the set screw members 18 inserted through the respective holes 13 into the screw holes 17 and then screwed firmly into the respective cylindrical posts 16 integral with the top wall U1a. In this condition, the release button 14 is exposed to the outside through the rectangular opening 15 and the pawl member 9 is positioned immediately below the access slot 7.

The lock mechanism of the present invention operates in the following manner.

Assuming that the display panel assembly 4 in the erected position as shown in FIG. 1 is pivoted towards the folded position, the associated engaging member 6 attached to the display panel assembly 4 enters the respective access slot 7 shortly before it is caught by the associated pawl member 9. The engaging member 6 entering the access slot 7 engages the pawl member 9, causing the latter to displace backwardly generally clockwise as viewed in FIG. 2) to allow the further passage of the engaging member 6 in front of the pawl member 9. This is possible because there is a generally L-shaped connection between each lug 12 and the associated plate-like arm 11 as hereinbefore detailed and because the plate-like arms 'bow' relative to the lugs 12 upon the engagement of the engaging member 6 with the pawl member 9. When the display panel assembly 4 is completely moved to the folded position the pawl member 9 is resiliently returned to the original position while having been engaged in the engaging member 6 in a hooked fashion. Thereby, the display panel assembly 4 is locked in the folded position.

When the display panel assembly 4 is desired to be moved to the erected position, the operator should apply a finger pressure to each release buttons 14. The application of the external finger pressure to the release button 14 causes the latter to be retracted inwardly of the upper cabinet UC while the plate-like arms 11 are deformed against their own resiliency while substantially pivoting about the set screw members 18, resulting in the separation of the pawl member 9 away from the engaging member 6. Removal of the finger pressure from the release button 14 subsequent to the lifting of the display panel assembly 4 allows the release button member 14 to return to the original projected position.

From the foregoing description, it is clear that, since the plate-like arms 11 integral with and extending away from the release button 14 are resilient, the use of any spring member such as necessitated in the prior art lock mechanism can be advantageously eliminated. In addition, since the release member 8 is a one-piece construction made of synthetic resin and including the pawl member 9, the arms 11, the fitting lugs 12 and the release button 14, the number of necessary component parts for the lock mechanism and, also, the number of necessary steps required to fit the lock mechanism to the casing can be advantageously minimized.

The foldable handle assembly according to the present invention is best shown in FIGS. 3 to 7. The handle assembly shown therein comprises a generally U-shaped handle generally identified by 20. The handle 20 which may be of one-piece construction is supported for pivotal movement between concealed and projected positions, shown in FIGS. 6 and 7, respectively, in a manner as will be described later. The handle 20 includes a grip portion 24 extending generally parallel to the front wall L1d of the lower cabinet CL and a pair of generally flat arms 23 extending from opposite ends of the grip portion 24 in a direction perpendicular to the grip portion 24 and also to the front wall L1d of the lower cabinet CL. As will become clear from the subsequent description, the handle 20 is coupled to the lower cabinet CL with any one of the opposite surfaces of each of the arms 23 lying in a plane generally parallel to the bottom wall L1a of the lower cabinet CL when and so long as the handle 24 is held in either the concealed position or the projected position.

As best shown in FIGS. 3 and 4, one end of each of the arms 23 opposite to the grip portion 24 is integrally formed with a pair of generally cylindrical bosses 25a and 25b so as to protrude laterally outwardly therefrom in coaxial relationship with each other, thereby rendering the respective arm 23 to represent a generally T-shaped configuration. A portion of the periphery of each of the bosses 25a and 25b is cut away to provide a flank 25a-1 or 25b-1. The flank 25a-1 or 25b-1 lies in a plane inclined at a predetermined angle, for example, 20°, downwardly relative to the longitudinal axis of the associated arm 23 as viewed in FIG. 5. The function of the flanks 25a-1 and 15b-1 on each of the arms 23 will become clear from the subsequent description, however, briefly speaking, they cooperate with resilient retainers 36 and 37 (FIGS. 5 to 7) to retain the handle 24 in the concealed position without allowing the handle 24 to arbitrarily pivot about the common longitudinal axis of the bosses 25a and 25b to come out of the concealed position as best shown in FIG. 6.

The bottom wall L1a of the lower cabinet CL is formed with a generally U-shaped pocket 21 opening in a direction opposite to the upper cabinet CU and positioned intermediate the width of the lap-top personal computer and in the vicinity of the front wall L1d. The U-shaped pocket 21 is composed of a widthwise groove 21b, defined at a location spaced a distance from the front wall L1d of the lower cabinet CL so as to extend parallel thereto, and parallel grooves 21a continued to the widthwise groove 21b and extending perpendicular to and between the front wall L1d and the widthwise groove 21b. The bottom wall L1a has an access recess 22 defined therein in communication with the widthwise groove 21b for the access by an operator's finger to the grip portion 24 of the handle 20 when the latter is held in the concealed position so that the operator can pull the handle 24 out of the pocket 22 and move it to the erected position while allowing the handle 24 to pivot about the common longitudinal axis of the bosses 25a and 25b. The pocket 21 is so designed and so sized as to accommodate the handle 24, with the grip portion 24 and the arms 23 seated within the widthwise groove 21b and the parallel grooves 21a, respectively, when and so long as the latter is in the concealed position as shown in FIG. 6.

The bottom wall L1a of the lower cabinet CL is also formed with slide decks 26 and 27 for each arm 23. The said slide decks 26 and 27 extend from a position generally intermediate of the length of the associated groove 21a to the front wall L1d and are positioned on respective sides of the associated groove 21a while having been downwardly offset relative to the bottom of the lower cabinet CL as viewed in FIGS. 5 to 7. The slide decks 27 and 28 for each groove 21a are formed with respective cutouts 28 and 29 opposed to each other and positioned in the vicinity of respective inner ends of the slide decks 26 and 27. The cutouts 28 and 29 are so sized and so operable as to permit the bosses 25a and 25b integral with the arms 23 to pass therethrough. It is, however, to be noted that one of the cutouts, for example, the cutout 28 has a length L (FIG. 4) smaller than that of the other of the cutouts, that is, the cutout 29, so that the bosses 25a and 25b can be seated on the slide decks 26 and 27 after the handle 20 fitted to the lower cabinet CL with the bosses 25a and 25b passed through the cutouts 28 and 29 has been displaced laterally leftwards in a manner as indicated by the arrow-headed lines in FIG. 4.

Figure 5:
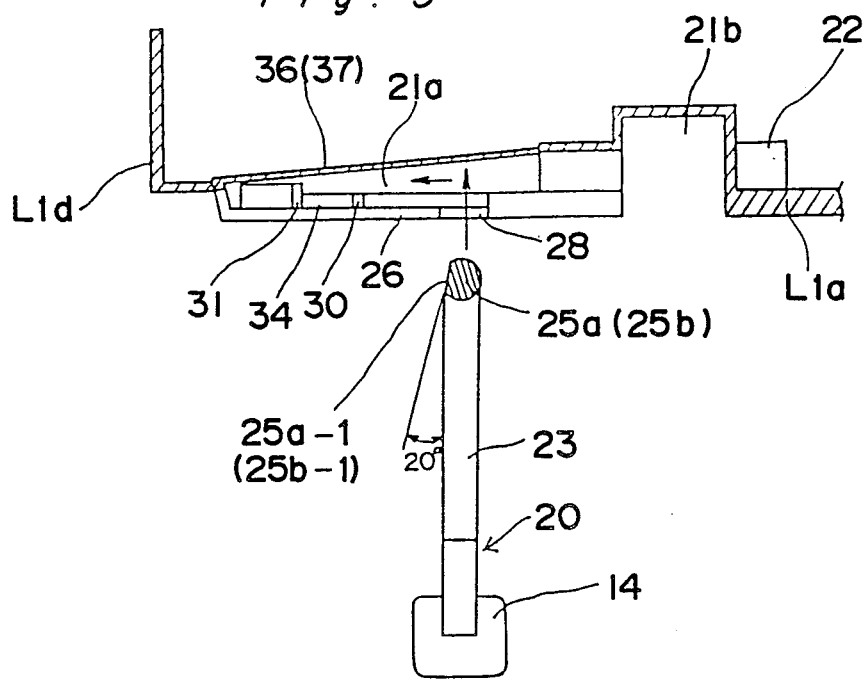
FIG. 5 is a cross-sectional view taken along the line V—V in FIG. 4, showing how a handle is coupled to the lap-top model.
Figure 6:
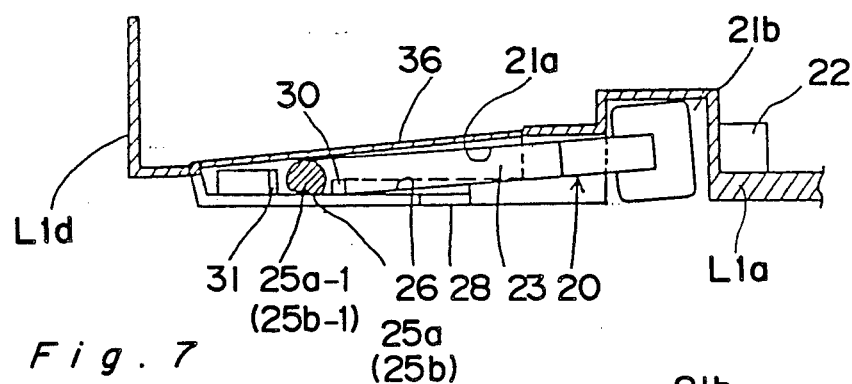
FIGS. 6 and 7 are views similar to FIG. 5, showing the handle held in concealed and exposed positions, respectively.
Figure 7:
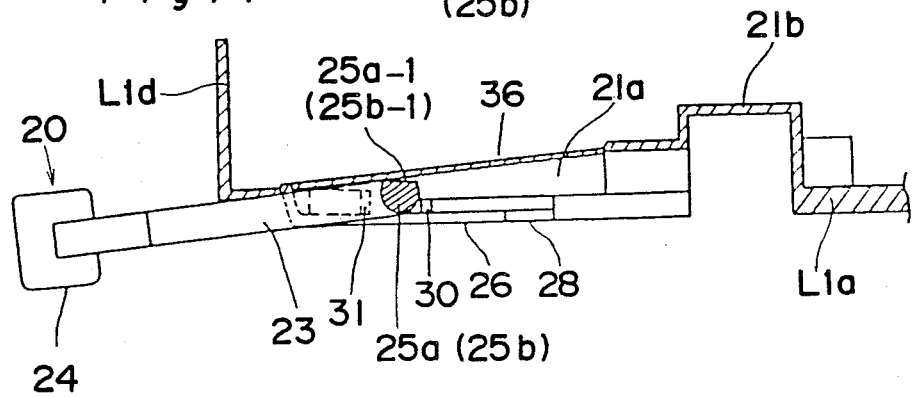

Respective outer ends of the slide decks 26 adjacent the front wall L1d of the lower cabinet CL are formed with tall and low engagement projections 30 and 31 protruding upwardly towards the upper cabinet CU as viewed in FIGS. 5 to 7 and spaced from each other a distance corresponding to the maximum diameter of the associated boss 25a. Similarly, respective outer ends of the slide decks 27 adjacent the front wall L1d of the lower cabinet CL are formed with tall and low engagement projections 32 and 33 protruding upwardly towards the upper cabinet CU as viewed in FIGS. 5 to 7 and spaced from each other a distance corresponding to the maximum diameter of the associated boss 25b. Spaces 34 between the engagement projections 30 and 31 and spaces 35 between the engagement projections 32 and 33 are utilized to accommodate the bosses 25a and 25b on the arms 23 of the handle 20 so that, during the pivotal movement of the handle 20, the bosses 25a and 25b can rotate within such respective spaces.

Positioned interiorly of the carrying case 1 and generally above the paired slide decks 26 and 27 are the resilient retainers 36 and 37 operable to retain the handle 20 in the concealed position without allowing the handle 20 to arbitrarily pivot about the common longitudinal axis of the bosses 25a and 25b. The resilient retainers 36 and 37 are integral parts of the respective bottom walls of the parallel grooves 21a as viewed in FIG. 3 and, as best shown in FIGS. 5 to 7, extends towards the front wall L1d while being inclined downwardly so as to converge with the bottom wall L1a. It should be noted that the minimum distance between each resilient retainer 36 or 37 and any one of the respective slide decks 26 and 27 is substantially equal to or slightly smaller than the minimum diameter of any one of the bosses 25a and 25b. The minimum diameter of each bosses 25a or 25b is the one measured in a direction perpendicular to the associated flank 25a-1 or 25b-1 and passing through the longitudinal axis of the respective boss 25a or 25b.

When the handle 20 is to be fitted to the carrying case 1, the bosses 25a and 25b on the arms 23 having been aligned with the cutouts 28 and 29 are to be first inserted from below into the cutouts 28 and 29 as shown by the arrow-headed line in FIG. 5, and the handle 20 as a whole is then displaced a slight distance laterally in a direction parallel to the common longitudinal axis of the bosses 25a and 25b as shown by the arrow-headed line in FIG. 4 to let the bosses 25a and 25b be seated on the slide decks 26 and 27. This lateral displacement of the handle 20 after the bosses 25a and 25b have been inserted through the cutouts 28 and 29 is required because the cutouts 28 and 29 are of different depth and are laterally offset relative to the longitudinal center line of the associated parallel grooves 21a.

Thereafter, the handle 14 is pulled forwards, i.e., leftwards as viewed in FIGS. 5 to 7, until the bosses 25a and 25b ride over the low engagement projections 30 and 32 on the slide decks 26 and 27 and slide into the spaces 34 and 35, defined between the tall and low engagement projections 31, 32 and 34, 35, as shown in FIGS. 6 and 7. At this time, the associated resilient retainers 36 and 37 are deformed against their own elasticity in contact with the free ends of the arms 23 to allow the bosses 25a and 25b to ride over the low engagement projections 30 and 31 on the slide decks 26 and 27. By so doing, the bosses 25a and 25b are confined within the spaces 34 and 35 for pivotal movement of the handle 20 between the projected position, as shown in FIG. 7, and the concealed position as shown in FIG. 6.

When and so long as the handle 20 is in the concealed position, the handle 20 is accommodated within the U-shaped pocket 21 with the arms 23 lying in the parallel grooves 21a and the grip portion 24 lying in the widthwise groove 21b. However, when and so long as the handle 20 is moved to the projected position after having been pivoted about the common longitudinal axis of the bosses 25a and 25b, the arms 23 partially protrude outwards from the perimeter of the lower cabinet CL with the grip portion 24 spaced apart from the front wall L1d for access by the hand of the operator of the lap-top model personal computer.

In this arrangement, friction is imparted at all times by the resilient retainers 36 and 37 to the bosses 25a and 25b. In particular, when the handle 20 is held in either one of the projected and concealed positions, the handle 20 will not undergo any arbitrary motion because the bosses 25a and 25b are urged by the resiliency of the resilient retainers 36 and 37 to cause the flanks 25a-1 and 25b-1 to engage the associated resilient retainers 36 and 37 or the slide decks 26 and 27 in face-to-face relationship as shown in FIGS. 7 and 6, respectively. The handle 20 in the concealed position can be readily pulled out by inserting the finger into the access recess 22 (FIG. 3) and then drawing the grip portion 24 downwards as viewed in FIG. 6.

From the foregoing description, it is clear that, since the support structure to which the handle 20 is fitted is integrally formed with the lower cabinet CL and no other separate component is employed, not only can the number of necessary component parts be advantageously reduced, but the number of procedures necessary to fit the handle to the lower cabinet CL can also be reduced. Moreover, since the U-shaped pocket for accommodating the handle is defined in the bottom wall of the casing of the lap-top type personal computer, the handle will not interfere with the operability of the keyboard arrangement and no relatively large space is required thereby enabling a relatively increased number of electric component parts to be accommodated beneath the keyboard arrangement.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A lock mechanism for a carrying case which comprises a generally box-like casing accommodating various electric components therein and having a panel assembly generally hingedly supported for movement in a direction towards and away from the casing, and at least one lock mechanism operable to lock the panel assembly in a closed position to the casing, said lock mechanism comprising:
   an engagement member secured to the panel assembly; and
   a release member of one-piece construction made of synthetic resin and including a release button, a support tongue formed integrally with and extending from the release button in a direction inwardly of the casing, a pawl member integrally formed with an extending from one end of the support tongue at a position remote from the release button, said pawl extending in a direction generally perpendicular to the support tongue, a pair of resiliently yieldable, generally plate-like arms formed integrally with and extending from the release button in a direction away from each other and also extending generally perpendicular to the support tongue, and a perforated fitting lug formed integrally with one end of each of the resiliently yieldable arms at a position remote from the release button and lying in a plane generally perpendicular to the associated resiliently yieldable arm.

2. The lock mechanism as claimed in claim 1, wherein the release member is secured to the casing with set screw members inserted through perforations in the respective fitting lugs and then screwed into a wall of the casing.

3. A handle assembly for a carrying case which comprises a generally box-like casing accommodating various electric components therein and having a bottom opening, and a bottom lid secured from below to the casing to close the bottom opening thereof and formed with a generally U-shaped pocket during the molding of the bottom lid by the use of plastics molding technique, said assembly comprises:
   a foldable handle hingedly carried by the bottom lid for pivotal movement between a concealed position, in which the handle is housed within the U-shaped pocket without protruding from the bottom lid, and an exposed position in which the handle is exposed outside the perimeter of the casing for access by an operator;
   said U-shaped pocket including a pair of side grooves and a bridging groove continued to and extending between respective ends of the side grooves;
   said bottom lid being formed with a pair of slide decks positioned on respective sides of each side groove, a pair of stopper projections each located at one end of the associated slide deck that is remote from the bridging groove, and a thin elastic plate in face-to-face relationship with each slide deck; and
   a handle including a pair of spaced arms, each of said arms having one end formed into a generally T-shaped configuration with bosses protruding therefrom in a direction away from each other and generally perpendicular to the associated arm, said handle being coupled to the bottom lid with the bosses in the arms having been inserted through the cutouts until they are engaged between the respective pairs of the stopper projections after having slid along the respective slide supports, said handle assembly so coupled to the bottom lid being pivotable about a common longitudinal axis passing through the bosses in the arms in a controlled manner with the bosses in the arms resiliently pressed by the thin elastic plates.

4. A carrying case which comprises a generally box-like casing accommodating various electric components therein and having a panel assembly generally hingedly supported for movement in a direction towards and away from the casing, a foldable handle assembly supported for pivotal movement between concealed and projected positions, and at least one lock mechanism operable to lock the panel assembly in a closed position to the casing, said lock mechanism comprising:
   an engagement member secured to the panel assembly; and
   a release member of one-piece construction made of synthetic resin and including a release button, a support tongue formed integrally with an extending from the release button in a direction inwardly of the casing, a pawl member integrally formed with and extending from one end of the support tongue at a position remote from the release button, said pawl extending in a direction generally perpendicular to the support tongue, a pair of resiliently yieldable, generally plate-like arms formed integrally with and extending from the release button in a direction away from each other and also extending generally perpendicular to the support tongue, and a perforated fitting lug formed integrally with one end of each of the resiliently yieldable arms at a position remote from the release button and lying in a plane generally perpendicular to the associated resiliently yieldable arm.

5. The carrying case as claimed in claim 4, wherein said handle assembly comprises:

a foldable handle hingedly carried by the bottom lid for pivotal movement between a concealed position, in which the handle is housed within a generally U-shaped pocket of a bottom lid of the casing without protruding from the bottom lid, and an exposed position in which the handle is exposed outside the perimeter of the casing for access by an operator;

said U-shaped pocket including a pair of side grooves and a bridging groove continued to and extending between respective ends of the side grooves;

said bottom lid being formed with a pair of slide decks positioned on respective sides of each side groove, a pair of stopper projections each located at one end of the associated slide deck that is remote from the bridging groove, and a thin elastic plate in face-to-face relationship with each slide deck; and a handle including a pair of spaced arms, each of said arms having one end formed into a generally T-shaped configuration with bosses protruding therefrom in a direction away from each other and generally perpendicular to the associated arm, said handle being coupled to the bottom lid with the bosses in the arms having been inserted through the cutouts until they are engaged between the respective pairs of the stopper projections after having slid along the respective slide supports, said handle assembly so coupled to the bottom lid being pivotable about a common longitudinal axis passing through the bosses in the arms in a controlled manner with the bosses in the arms resiliently pressed by the thin elastic pieces.

6. A carrying case which comprises a generally box-like casing accommodating various electric components therein and having a bottom lid attached thereto, a panel assembly generally hingedly supported for movement in a direction towards and away from the casing, a foldable handle assembly supported for pivotal movement between concealed and projected positions, and at least one lock mechanism operable to lock the panel assembly in a closed position to the casing, said handle assembly comprises:

a foldable handle hingedly carried by the bottom lid for pivotal movement between a concealed position, in which the handle is housed within a generally U-shaped pocket without protruding from the bottom lid, and an exposed position in which the handle is exposed outside the perimeter of the casing for access by an operator;

said U-shaped pocket including a pair of side grooves and a bridging groove continued to and extending between respective ends of the side grooves;

said bottom lid being formed with a pair of slide decks positioned on respective sides of each side groove, a pair of stopper projections each located at one end of the associated slide deck that is remote from the bridging groove, and a thin elastic plate in face-to-face relationship with each slide deck; and a handle including a pair of spaced arms, each of said arms having one end formed into a generally T-shaped configuration with bosses protruding therefrom in a direction away from each other and generally perpendicular to the associated arm, said handle being coupled to the bottom lid with the bosses in the arms having been inserted through the cutouts until they are engaged between the respective pairs of the stopper projections after having slid along the respective slide supports, said handle assembly so coupled to the bottom lid being pivotable about a common longitudinal axis passing through the bosses in the arms in a controlled manner with the bosses in the arms resiliently pressed by the thin elastic plates.

7. The carrying case as claimed in claim 6, wherein said lock mechanism comprises:

an engagement member secured to the panel assembly; and a release member of one-piece construction made of synthetic resin and including a release button, a support tongue formed integrally with and extending from the release button in a direction inwardly of the casing, a pawl member integrally formed with and extending from one end of the support tongue in a position remote from the release buttons, said pawl extending in a direction generally perpendicular to the support tongue, a pair of resiliently yieldable, generally plate-like arms formed integrally with and extending from the releases button in a direction away from each other and also extending generally perpendicular to the support tongue, and a perforated fitting lug formed integrally with one end of each of the resiliently yieldable arms at a position remote from the release button and lying in a plane generally perpendicular to the associated resiliently yieldable arm.

* * * * *